United States Patent
Chhatwal

[11] Patent Number: 5,841,637
[45] Date of Patent: Nov. 24, 1998

[54] ESD-PROTECTIVE HOUSING FOR ELECTRONICALLY OPERATED LOCK

[75] Inventor: Kn Singh Chhatwal, Melbourne, Fla.

[73] Assignee: Intellikey Corporation, Melbourne, Fla.

[21] Appl. No.: 618,068

[22] Filed: Mar. 25, 1996

[51] Int. Cl.⁶ .................................................... H05K 7/04
[52] U.S. Cl. ........................... 361/753; 361/809; 70/278; 174/51
[58] Field of Search ..................................... 361/753, 728, 361/747, 807, 809; 70/278; 174/51; 429/96, 100

[56] References Cited

U.S. PATENT DOCUMENTS

| | | | |
|---|---|---|---|
| 332,849 | 12/1885 | Voll | 70/450 |
| 425,237 | 4/1890 | Morton | 70/450 |
| 867,574 | 10/1907 | Egge . | |
| 2,785,565 | 3/1957 | Schlage . | |
| 3,663,864 | 5/1972 | Carlson et al. | 361/753 X |
| 4,456,290 | 6/1984 | Gross et al. | 292/337 |
| 4,534,487 | 8/1985 | Rapata | 220/305 |
| 4,667,266 | 5/1987 | Masuoka et al. | 361/753 X |
| 4,759,466 | 7/1988 | Chase et al. | 361/753 X |
| 4,841,414 | 6/1989 | Hibino et al. | 361/753 X |
| 5,383,098 | 1/1995 | Ma et al. | 361/753 X |
| 5,397,587 | 3/1995 | Farquhar et al. | 361/753 X |
| 5,434,747 | 7/1995 | Shibata | 361/753 |
| 5,502,620 | 3/1996 | Funck et al. | 361/753 |
| 5,537,294 | 7/1996 | Siwinski | 361/753 |
| 5,608,611 | 3/1997 | Szudarek et al. | 361/753 |

FOREIGN PATENT DOCUMENTS

| | | | |
|---|---|---|---|
| 3-14295 | 1/1991 | Japan | 361/753 |
| 5-343880 | 12/1993 | Japan | 361/753 |

*Primary Examiner*—Lloyd A. Gall
*Attorney, Agent, or Firm*—Charles E. Wands

[57] ABSTRACT

In order to provide a secure housing assembly for an electronic lock, while also providing protection against electrostatic discharge, a conductive plate-based housing assembly is configured to be installed within either a door mortise, or as an escutcheon housing mountable to the exterior of the door. For either installation, the same metallic plate sub-assembly is employed as both a support structure for a circuit board of the lock's electronic circuitry and as a wall of the protective housing. Since the circuit board's ground conductor layer is electrically connected to the metallic plate via conductive mounting standoffs, the lock circuitry is protected against damage due to electrostatic discharge when a key is inserted into a keyway of the lock.

14 Claims, 3 Drawing Sheets

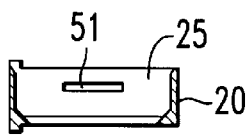
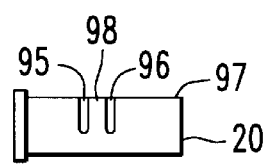
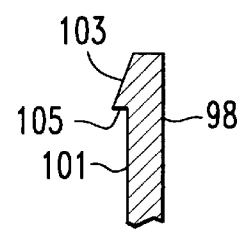
FIG. 7　　FIG. 8　　FIG. 9
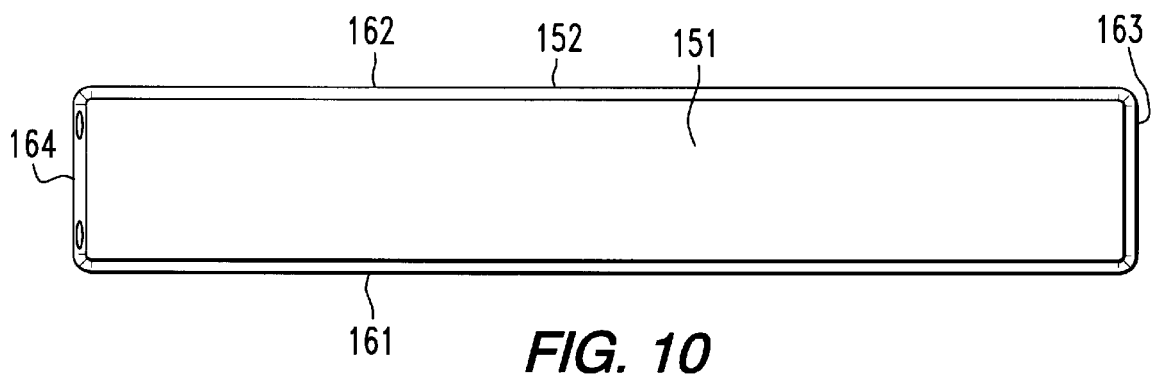
FIG. 10
FIG. 11
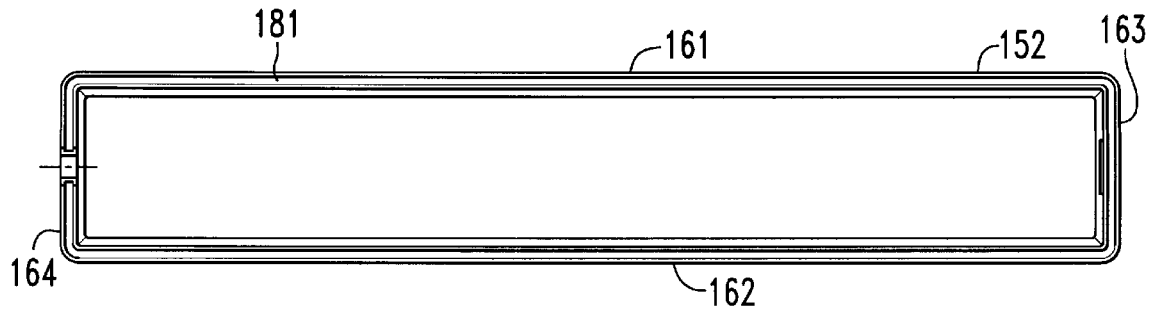
FIG. 12

5,841,637

ESD-PROTECTIVE HOUSING FOR ELECTRONICALLY OPERATED LOCK

FIELD OF THE INVENTION

The present invention relates in general to door-installed electronic locks, and is particularly directed to a housing assembly for an electronic lock that includes an electrically conductive support plate-based, circuit-mounting subassembly, which provides grounding protection against electrostatic discharge (ESD), which might otherwise damage and render inoperative the electronic circuitry of the door lock.

BACKGROUND OF THE INVENTION

Door-installed electronic locks are generally of two types: those which are installed in a door mortise, as is the case, for example, for an exterior metal (e.g., aluminum or steel)-framed glass door, such as those having metallic stile and rail components, or those which are installed in an escutcheon on the outside of a door, as is the case of an interior wood or steel door, for example. Where the electronic lock is installed in a door mortise, it is normally surrounded by a cover or casing for protecting the components of the lock assembly against the environment. Because the dimensions of metal-framed glass doors are relatively narrow, the overall dimensions of the protective housing assembly are limited, mandating the use of a relatively thin walled protective cover, which is typically made of a dielectric material, such as polycarbonate plastic, for example.

Once installed in the door, whenever a key is inserted into the lock assembly keyway, the lock may be subjected to electrostatic discharge (ESD), which can be as high as twenty thousand volts. Unfortunately, since the cover, like most of the components of the housing assembly, are customarily made of dielectric material, there is no effective shield or by-pass circuit path to ground to prevent the electrostatic discharge from damaging or destroying the lock's electronic circuit components-rendering the lock inoperative.

SUMMARY OF THE INVENTION

Pursuant to the present invention, the need to provide a secure housing assembly for an electronic lock, while also providing protection against electrostatic discharge (ESD), is successfully achieved by means of a new and improved conductive (e.g., metallic) plate-based housing assembly for a door-installed electronically operated lock mechanism, that may be configured to be installed within either a mortise in the door stile, or as an escutcheon housing mountable to the exterior of the door stile.

Regardless of the installation, a common metallic plate sub-assembly is employed as a support structure for a circuit board of the lock's electronic circuitry and as a wall of the protective housing. The circuit board contains a ground conductor layer which is electrically connected to the metallic plate via conductive mounting standoffs therebetween. The electronic circuitry is powered by way of a battery pack clip-mounted to the metallic plate adjacent to the circuit board.

For mortise installation, the metallic plate, which is preferably made of stainless steel, has a generally L-shaped flange at a first end of the plate that extends above and projects slightly beyond the end edge, allowing the flange to fit within a corresponding slot within a first end of a protective casing, which is sized to fit within the mortise of a door stile. The second end edge of the support plate has a raised ledge portion sized to engage a lip of a flexible snap fitting of the protective cover. The second end edge of the plate also includes a pair of tabs which extend generally vertically from the plate surface. The tabs contain tapped holes that are sized to be engaged by screws insertable through holes in an end wall of the protective casing of an escutcheon cover of the second embodiment of the invention. The plate also includes mounting holes sized to receive screws for attaching the plate to a door, when the plate is attached to the escutcheon cover of the second embodiment of the invention.

The protective mortise cover comprises a generally rectangularly shaped dielectric casing having a sidewall portion and a base wall portion. One end of the sidewall portion of the protective cover has a slot that receives the generally L-shaped flange of the plate at the first end edge of the plate. A second end of the sidewall portion of the cover has a pair of parallel slots which extend from an edge and thereby form a web that is flexible in and out of the plane of the second endwall portion. An interior end surface portion of the web has a chamfered surface and a lip that form the flexible snap fitting for the protective cover.

The snap fitting engages the raised ledge portion of the plate, when the flange at the first end edge of the plate is inserted into the slot of the cover and the plate is pivoted about the flange so that its second end edge comes into engagement with the second end of the sidewall portion of the cover, thereby securely attaching the protective cover to the plate and enclosing the electronic lock circuitry within the mortise housing.

Because of the very narrow dimensions of the stile and rail components of metallic door frames into which the first embodiment of the invention may be installed, and the size thickness or height of the battery pack, the interior height of the protective cover above the support plate may be insufficient to allow for the overall height of the battery pack. To provide for this increased thickness of the battery pack, the protective cover may have an aperture that is sized to permit partial entry of the battery pack through the wall thickness of the cover and thereby keep the total height of the cover to a dimension that allows insertion of the housing assembly into the door mortise. Likewise, that portion of the cover directly adjacent to the circuit board has an aperture, sized to accommodate partial entry of a component, such as a buzzer device, mounted to the circuit board and the height of which above the circuit board is greater than the interior height of the cover above the surface of the plate.

The protective cover for an escutcheon housing assembly of the second embodiment of the invention is configured to interfit with the same metallic plate upon which the electronic lock components are mounted in the first embodiment. The escutcheon-configured cover comprises a generally elongated, rectangularly shaped metallic casing. A first end wall of the cover has a depression which receives the generally L-shaped flange at the first end edge of the plate. A second end wall of the cover has a pair of holes that coincide with the tapped holes in the respective tabs at the second end edge of the plate, so that screws may be inserted through the holes in the cover and threaded into tapped holes of the tabs of the plate, to securely attach the plate to the escutcheon cover. The escutcheon cover also has groove sized to receive a gasket, which seals the cover against a door and prevents entry of moisture into the interior of the cover which houses the electronic lock circuitry.

BRIEF DESCRIPTION OF THE DRAWINGS

FIG. 7 is a diagrammatic interior cross-sectional end view of the protective mortise cover of FIG. 4;

FIG. 8 is a diagrammatic exterior end view of the protective mortise cover of FIG. 4;

FIG. 9 is an enlarged cross-sectional view of an end surface portion of the chamfered web of the exterior end view of the protective mortise cover shown in FIG. 8;

FIG. 10 is a diagrammatic exterior front view of an escutcheon cover of a second embodiment of the invention;

FIG. 11 is a diagrammatic cross-sectional side view of the escutcheon cover of FIG. 10;

FIG. 12 is a diagrammatic interior view of the escutcheon cover of FIG. 10;

DETAILED DESCRIPTION

Referring now to FIGS. 1–9, a first embodiment of the housing assembly according to the present invention, which is configured to protectively mount an electronically operated lock mechanism within a door mortise is diagrammatically illustrated as comprising an elongated, generally rectangular plate 10 that is joined with a protective casing 20, so that the two form a mechanically and electrically protective housing assembly for components of an electronically operated lock mechanism.

Figure 1:
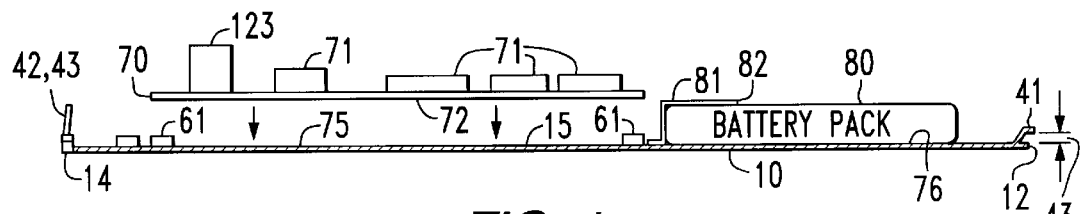
FIG. 1 is a diagrammatic side view of a mounting plate for electronic lock circuitry employed in the housing assembly of the present invention.
Figure 2:
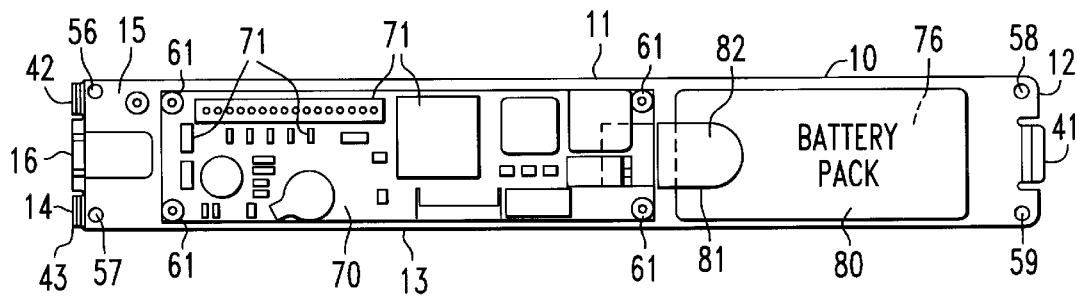
FIG. 2 is a diagrammatic top view of the electronic lock circuitry mounting plate of FIG. 1.
Figure 3:
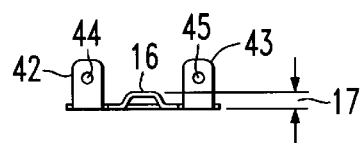
FIG. 3 is a diagrammatic end view of the electronic lock circuitry mounting plate of FIG. 1.

As shown in detail in FIGS. 1–3, an elongated, generally rectangular plate 10, which is made of a sturdy, electrically conductive material, such as stainless steel, has first and second generally rectilinear side edges 11 and 13, respectively, and first and second end edges 12 and 14, respectively. As shown in FIGS. 1 and 2, the first end edge 12 of plate 10 is configured to provide first, generally L-shaped flange 41, that extends a prescribed distance 43 above surface 15 of plate 10, and projects slightly beyond edge 12, so that flange 41 may fit within a corresponding slot 51 within a first end of a sidewall portion 21 of protective cover 20, shown in detail in FIG. 7, to be described.

The second end edge 14 of plate 10 is configured to include a raised ledge portion 16 that is offset by a distance 17 from the surface 15 of plate 10, and is sized to engage a lip of a flexible snap fitting of the protective cover 20, as will be described. The second end edge 14 of plate 10 further includes a pair of tabs 42 and 43, which are bent away from the plate 10, so that they extend generally vertically from its surface 15. Tabs 42 and 43 contain respective tapped holes 44 and 45, that are sized to be engaged by screws that are insertable through corresponding holes in an end wall of the protective casing of an escutcheon cover of the second embodiment of the invention, shown in FIGS. 10–15, to be described. The plate 10 further includes a plurality (four) of mounting holes 56, 57, 58 and 59, located adjacent to the corners of the plate. These mounting holes are sized to receive respective screws for attaching the plate to a mounting surface (e.g., door), when the plate is provided with the escutcheon cover of the second embodiment of the invention.

A plurality of spaced apart metallic mounting posts 61 are affixed to the surface 15 of the metallic plate 10, and provide for attachment of a printed circuit board 70, upon which the electronic circuitry 71 of the electronically operated lock mechanism is mounted, directly above a first surface region 75 of surface 15. Included as part of the circuitry 71 of the printed circuit board 70 is a ground conductor layer 72, which is electrically connected to one or more of the mounting posts 61, so that the ground conductor layer 72 of the printed circuit board is effectively hard-grounded to the metallic plate 10.

An electrical power supply unit, in the form of a multi-battery pack 80 is retained on a surface region 76 of the surface 15 of the metallic plate 10 immediately adjacent to the surface region 75, to facilitate electrical power connection to the printed circuit board 70. Battery pack 80 is retained on plate 10 by means of (metallic) bracket 81, which has a first portion 81 affixed (e.g. welded) to surface 15 of plate 10 and a raised tongue portion 82, which is biased sprung slightly toward surface 15 of plate 10, thereby enabling it to firmly retain the battery pack 80 between the tongue portion 82 and the surface 15 of the plate.

The protective mortise cover 20 of the first embodiment is shown in detail in FIGS. 4–9, as comprising a generally rectangularly shaped dielectric casing having a sidewall portion 21 and a base wall portion 22 solid therewith. The sidewall portion 21 has a rear sidewall portion 23 and a forward sidewall portion 24 and first and second endwall portions 25 and 26, respectively, that intersect and are solid with sidewall portions 23 and 24. Forward sidewall portion 24 of cover 20 extends beyond endwall portions 25 and 26, to provide door attachment portions having holes 91 and 92, through which screws and the like may pass for securely attaching the cover 20 and thereby the overall housing assembly within the mortise of a door stile.

As shown in the end view of FIG. 7, endwall portion 25 contains a slot 51 that is sized and shaped to receive the generally L-shaped flange 41 at the first end edge 12 of plate 10, as described above. Similarly, as shown the end view of FIG. 8, the second endwall portion 26 has a pair of parallel slots 95 and 96 which extend from an edge 97 and thereby form a web 98 that is flexible in and out of the plane of the second endwall portion 26. As shown in enlarged detail in FIG. 9, an interior end surface portion 101 of web 98 has a chamfered surface 103 and a lip 105, that projects toward the opposite end wall portion 25 of the cover 20. The chamfered surface 103 and the lip 105 of web 98 effectively form the above referenced flexible snap fitting for the protective cover 20, referenced above, which engages the raised ledge portion 16 of the plate 10, when the flange 41 at the first end edge 12 of the plate is inserted into slot 51 of endwall portion 25, and the plate is pivoted about flange 41 so that its second end edge 14 comes into engagement with endwall portion 26 of cover 20, thereby securely attaching the mortise cover 20 to the plate 10 and enclosing the electronic lock circuitry within the housing.

As described above, because of the very narrow dimensions of metallic door stiles into which the mortise installed housing assembly of the present embodiment may be installed, and the size thickness or height of the battery pack 80, the interior height of the mortise cover 20 above the surface 15 of the plate 10 may be insufficient to allow for the overall height of the battery pack 80. To accommodate this increased thickness of the battery pack 80, the base wall portion 22 of the mortise cover 20 may be provided with a first generally rectangular aperture 111, the perimeter of which is slightly larger than that of the battery pack, so as to permit partial entry of the battery pack through the wall thickness of the mortise cover 20, and thereby keep the total height of the cover 20 to a dimension that allows insertion of the housing assembly into the door mortise.

Similarly, that portion of the base wall portion 22 of the mortise cover 20 directly adjacent to the printed circuit board may have one or more apertures, one of which is shown at 121, sized to accommodate partial entry of one or more respective components that are mounted to the circuit board and the height of which above the circuit board is greater than the interior height of cover 20 above the surface 15 of plate 10. In the illustrated example, aperture 121 is shown as a circular aperture which is sized to receive a cylindrical buzzer device 123. If the height of the mounted component is only slightly greater than the interior height of the cover, then a slight depression, as shown for example at 125 and 127 in the base wall portion 22 of the mortise cover 20, rather than an aperture, such as apertures 111 and 121, may be sufficient to accommodate the height of the component. The apertures and depressions in the base wall portion 22 of mortise cover 20 are located so as to be aligned with the increased height components that are supported by the plate 10, whereby, in its assembled configuration, no portion of the housing assembly has a thickness greater than the interior dimension of the door mortise.

FIGS. 10–15 diagrammatically illustrate the configuration of an escutcheon mortise cover in accordance with a second embodiment of the invention, which readily interfits with the same metallic plate 10 upon which the electronic lock components are mounted in the first embodiment. As shown therein, the escutcheon-configured cover 150 comprises a generally elongated, rectangularly shaped metallic casing having a front wall portion 151 and a sidewall 152 solid therewith. The sidewall portion 152 has first and second sidewalls 161 and 162 and first and second end walls 163 and 164, that intersect and are solid with sidewalls 161 and 162.

Figure 13:
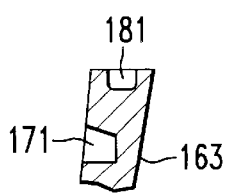
FIG. 13 is an enlarged cross-sectional view of a first end wall of the escutcheon cover of FIG. 10.
Figure 14:
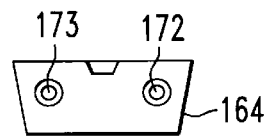
FIG. 14 is a diagrammatic exterior view of the first end wall of the escutcheon cover of FIG. 10.
Figure 15:
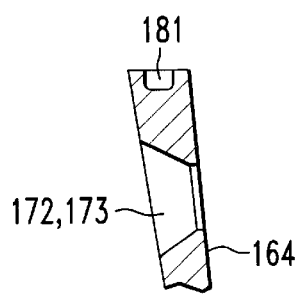
FIG. 15 is an enlarged cross-sectional view of a second end wall of the escutcheon cover of FIG. 10.
Figure 4:
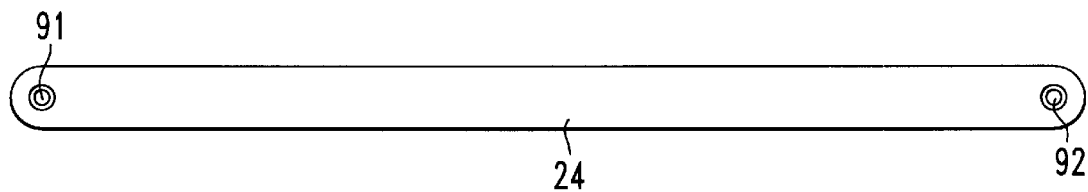
FIG. 4 is a diagrammatic front view of the protective mortise cover of the housing assembly of a first embodiment of the invention.
Figure 5:
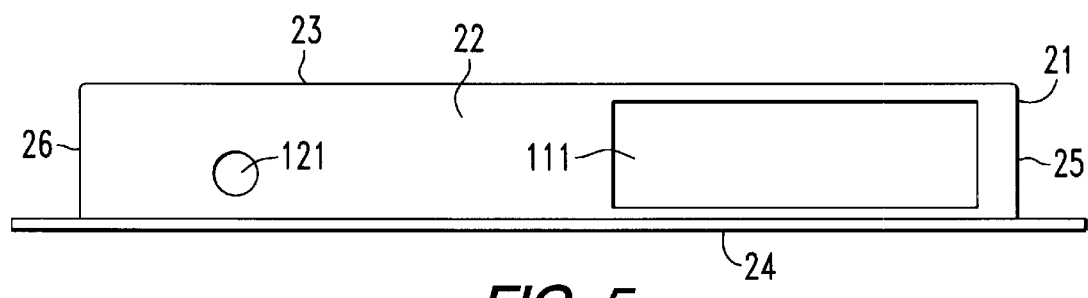
FIG. 5 is a diagrammatic exterior side view of the protective mortise cover of FIG. 4.
Figure 6:
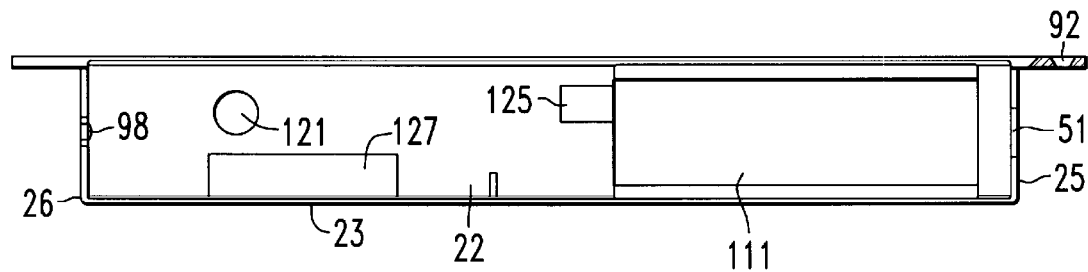
FIG. 6 is a diagrammatic interior side view of the protective mortise cover of FIG. 4.

As shown in enlarged detail in FIG. 13, end wall 163 contains a depression 171 that is sized and shaped to receive the generally L-shaped flange 41 at the first end edge 12 of plate 10. As shown in FIG. 14 and in enlarged detail in FIG. 15, the second end wall 164 has a pair of holes 172 and 173 that coincide with the tapped holes 44 and 45 in the respective tabs 42 and 43 at the second end edge 14 of plate 10, described above, so that screws may be inserted through holes 172 and 173 and threaded into tapped holes 44 and 45 of the tabs 42 and 43, to securely attach the plate to the escutcheon cover 150, and enclosing the electronic lock circuitry within the escutcheon housing.

As described briefly above, in the second embodiment the plate 10 is attached to a door by means of screws passing through the mounting holes 56, 57, 58 and 59, located adjacent to the corners of the plate. As shown in FIGS. 11 and 12, the escutcheon cover 150 has groove 181, which is sized to receive a gasket that seals the cover against its mounting surface, and thereby prevents the entry of moisture and foreign matter into the interior of the cover which houses the electronic lock circuitry. Thus, the escutcheon housing 150 forms front and sidewalls of the unit, while the plate 10 serves as a rear closure, housing the lock circuitry in the interior of the unit. With the escutcheon housing 150 mounted in a sealed manner against the surface of the door, the circuitry 71 on the circuit board 70 (mounted to plate 10) is completely protected.

As will be appreciated from the foregoing description, the need to provide a secure housing assembly for an electronic lock, while also providing protection against electrostatic discharge is successfully achieved in accordance with the conductive plate-based housing assembly of the present invention, which may be configured to be installed within either a door mortise, or as an escutcheon housing mountable to the exterior of the door. As explained supra, for either installation, the common metallic plate sub-assembly is employed as both a support structure for a circuit board of the lock's electronic circuitry and as a wall of the protective housing. Since the circuit board's ground conductor layer is electrically connected to the metallic plate via conductive mounting standoffs, the lock circuitry is protected against ESD-sourced damage.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A housing assembly for protectively mounting an electronically operated lock mechanism with a door comprising:

an electrically conductive plate which serves as a first wall of said housing assembly, a first portion of said plate having a first attachment fitting configured to engage a first portion of a sidewall of either of a mortise type protective casing and an escutcheon type protective casing, a second portion of said plate having a second attachment fitting configured to engage a second portion of a sidewall of said mortise type protective casing, and a third portion of said plate having a third attachment fitting configured to engage a second portion of a sidewall of said escutcheon type protective casing;

said mortise type protective casing having a sidewall, and a basewall having a first height above said plate when said first attachment fitting engages said first portion of the sidewall of said mortise type protective casing and said second attachment fitting engages said second portion of the sidewall of said mortise type protective casing, so that said electrically conductive plate and said mortise type protective casing form a mortise housing assembly, said basewall of said mortise type protective casing further including a first aperture sized to accommodate partial entry therethrough of an electrical power supply mounted to said plate, and said sidewall of said mortise type protective casing being configured for attachment with a door mortise;

said escutcheon type protective casing having a sidewall, and a basewall that has a second height above said plate when said first attachment fitting engages said first portion of the sidewall of said escutcheon type protective casing, and said third attachment fitting engages said second portion of the sidewall of said escutcheon type protective casing, so that said electrically conductive plate and said escutcheon type protective casing form an escutcheon housing assembly;

a circuit board containing electronic circuitry for operating said lock mechanism, said circuit board being mounted to said electrically conductive plate and having a ground conductor layer which is electrically connected to said electrically conductive plate; and said electrical power supply mounted to said electrically conductive plate and extending a third height above said plate greater than said first height, and being electrically connected to and supplying electrical power to said electronic circuitry; and wherein one of said mortise type and said escutcheon type protective casings is engaged with said electrically conductive plate by way of attachment fittings therefor, so that said electrically conductive plate and said one of said mortise type and said escutcheon type protective casings together form said housing assembly, thereby enclosing therein said circuit board and said electrical power supply.

2. A housing assembly according to claim 1, wherein said electrically conductive plate is engaged with said mortise type protective casing.

3. A housing assembly according to claim 2, wherein said mortise type protective casing is made of electrically insulating material.

4. A housing assembly according to claim 2, wherein the basewall of said mortise type protective casing has a second aperture that is sized to accommodate partial entry of a component mounted to and extending a fourth height, greater than said first height, above said circuit board.

5. A housing assembly according to claim 4, wherein said component comprises an indicator device.

6. A housing assembly according to claim 2, wherein said first attachment fitting comprises a flange extending from a first end of said plate and configured to engage a slot in a first end of the sidewall of said mortise type protective casing, and said second attachment fitting comprises a raised ledge extending from a second end of said electrically conductive plate, and configured to receive a flexible tab at a second end of the sidewall of said mortise type protective casing.

7. A housing assembly according to claim 1, wherein said electrically conductive plate is engaged with said escutcheon type protective casing.

8. A housing assembly according to claim 7, wherein said protective casing is made of electrically conductive material.

9. A housing assembly according to claim 7, wherein said first attachment fitting comprises a flange extending from a first end of said plate and configured to engage a slot in a first end of the sidewall of said escutcheon type protective casing, and said third attachment fitting comprises a pair of tabs extending from a second end of said electrically conductive plate, and configured to receive fittings that engage a second end of the sidewall of said escutcheon type protective casing.

10. A housing assembly for protectively mounting an electronically operated lock mechanism with a door comprising:

an electrically conductive plate which serves as a first wall of said housing assembly, a first portion of said plate having a first attachment fitting configured to engage a first portion of a sidewall of a mortise type protective casing, and a second portion of said plate having a second attachment fitting configured to engage a second portion of said sidewall of said mortise type protective casing;

said mortise type protective casing having a sidewall, and a basewall having a first height above said plate when said first attachment fitting engages said first portion of the sidewall of said mortise type protective casing and said second attachment fitting engages said second portion of the sidewall of said mortise type protective casing, so that said electrically conductive plate and said mortise type protective casing form a mortise housing assembly, said basewall of said mortise type protective casing further including a first aperture sized to accommodate partial entry therethrough of an electrical power supply mounted to said plate, and said sidewall of said mortise type protective casing being configured for attachment with a door mortise;

a circuit board containing electronic circuitry for operating said lock mechanism, said circuit board being mounted to said electrically conductive plate and having a ground conductor layer which is electrically connected to said electrically conductive plate; and said electrical power supply mounted to said electrically conductive plate and extending a second height above said plate greater than said first height, and being electrically connected to and supplying electrical power to said electronic circuitry; and wherein said mortise type protective casing is engaged with said electrically conductive plate by way of said first and second attachment fittings therefor, so that said electrically conductive plate and said mortise type protective casing together form said housing assembly, thereby enclosing therein said circuit board and said electrical power supply, while said first aperture in said basewall of said mortise type protective casing accommodates said electrical power supply.

11. A housing assembly according to claim 10, wherein said mortise type protective casing is made of electrically insulating material.

12. A housing assembly according to claim 11, wherein the basewall of said mortise type protective casing has a second aperture that is sized to accommodate partial entry of a component mounted to and extending a third height, greater than said first height, above said circuit board.

13. A housing assembly according to claim 12, wherein said component comprises an indicator device.

14. A housing assembly according to claim 10, wherein said first attachment fitting comprises a flange extending from a first end of said plate and configured to engage a slot in a first end of the sidewall of said mortise type protective casing, and said second attachment fitting comprises a raised ledge extending from a second end of said electrically conductive plate, and configured to receive a flexible tab at a second end of the sidewall of said mortise type protective casing.

* * * * *